United States Patent [19]

Kay et al.

[11] 3,844,843

[45] Oct. 29, 1974

[54] SOLAR CELL WITH ORGANIC SEMICONDUCTOR CONTAINED IN A GEL

[75] Inventors: Robert E. Kay, Newport Beach; Earle R. Walwick, Irvine, both of Calif.

[73] Assignee: Philco-Ford Corporation, Blue Bell, Pa.

[22] Filed: Jan. 2, 1973

[21] Appl. No.: 320,099

[52] U.S. Cl. .................... 136/206, 136/89, 136/236

[51] Int. Cl. ........................................... H01l 15/02

[58] Field of Search .................. 136/89, 206, 236 A; 250/370

[56] References Cited

UNITED STATES PATENTS

| | | | |
|---|---|---|---|
| 3,009,006 | 11/1961 | Kostelec | 136/236 UX |
| 3,229,469 | 1/1966 | Katon | 136/236 |
| 3,252,061 | 5/1966 | Kepler et al. | 136/236 X |
| 3,511,991 | 5/1970 | Beerman | 136/213 UX |
| 3,522,339 | 7/1970 | teVelde | 136/89 X |
| 3,530,007 | 9/1970 | Golubovic | 136/89 |
| 3,615,854 | 10/1971 | Aten | 136/89 |

*Primary Examiner*—Benjamin R. Padgett
*Assistant Examiner*—E. A. Miller
*Attorney, Agent, or Firm*—Gail W. Woodward; Robert D. Sanborn

[57] ABSTRACT

A photovoltaic cell is fabricated from an active medium comprising an organic semiconductor in a gel. When a film of such material is sandwiched between transparent conducting electrodes a solar cell is obtained. The electrical output is greatly in excess of that obtained from prior art organic semiconductor solar cells of the same area.

10 Claims, 2 Drawing Figures

PATENTED OCT 29 1974 3,844,843

SOLAR CELL WITH ORGANIC SEMICONDUCTOR CONTAINED IN A GEL

BACKGROUND OF THE INVENTION

Organic semiconductors constitute a class of materials that has been extensively investigated as a possible substitute for the conventional crystalline semiconductor materials. In particular, since the photosensitivity of organic semiconductors is well known, many attempts have been made to produce therefrom photoelectric devices that could be used to replace the expensive single crystal devices now being used. The single crystal semiconductor solar cells now in use are quite expensive, but their use persists because the best organic semiconductor solar cells have efficiencies many orders of magnitude too low. Even if the organic semiconductor solar cell were to have an inferior electrical efficiency, its lower cost would make it competitive, provided that the efficiency differential is not too great. In the solar cell application, reduced efficiency results in a collection area penalty. Where collection area is a primary factor, such as in spacecraft applications, a more expensive cell will be tolerated. In other words, a basic device cost penalty will be accepted under certain conditions. However, when space is a lesser factor, such as in ground based systems, a moderate area penalty is acceptable because the cost penalty is no longer justified.

Organic dyes in general have proven to be semiconductors, and they are photoelectric in varying degrees. They display a photovoltaic response when operated in a suitable cell structure. Unfortunately, these organic dyes are essentially insulators and, therefore, produce cells that have very high impedence values. In an effort to develop more useful cells, many materials and methods of processing have been investigated, along with processes for making suitable cells. The most widely used known fabrication method is to dissolve the dye in a suitable solvent and then cast a thin film by solvent evaporation. Two such films cast upon transparent conducting surfaces can be pressed together to produce a photovoltaic cell. If the layers are thin enough, the high volume resistivity effect is reduced to a lower level. However, if the films are too thin, insufficient optical absorption occurs. Accordingly there is an optimum film thickness for any particular material. The two conducting surfaces provide the electrical connections, and light can be applied to the dye through either surface. If the light is to be applied through only one surface, the other one can be made opaque. A metal support plate can then be used.

Such materials as eosin, rose bengal, fluoroescein, erythorosin, crystal violet, malachite green, tetracene, pentascene, aceanthraquinoxaline, poly-n-vinylcarbazole, metal polyphthalocyanines and others have been used. They have been fabricated into suitable structures by casting from a solvent, vacuum evaporation, pyrolysis, and hot and cold powder compact pressing. While successful cells have been fabricated, none have produced efficiencies sufficiently high to compete with conventional cells. The area penalty in such cells is too great.

SUMMARY OF THE INVENTION

It is an object of the invention to produce an organic semiconductor solar cell having greatly improved efficiency over prior art devices.

It is a further object to provide organic semiconductor photovoltaic cells having internal resistance values much lower than the values of comparable area prior art devices.

It is a still further object to provide organic semiconductor solar cells of simplified construction using low cost materials.

These and other objects are achieved by casting a suitable organic semiconductor in thin film form using a gel structure to confine the semiconductor. A mixture of dye, gel, and solvent is applied to a conducting transparent coating on a glass base. Excess solvent is evaporated, or at least partially evaporated, and a counterelectrode is pressed against the gel surface. The resulting structure is photovoltaic and has an internal resistance that is much lower than cells produced with the prior art processes.

Water content in the gel can be stabilized by adding a humectant such as glycerol to the casting mixture. Cell efficiency can be further improved by incorporating dyes having different optical absorption bands into the casting mixture.

DESCRIPTION OF THE PREFERRED EMBODIMENT

Figure 1:
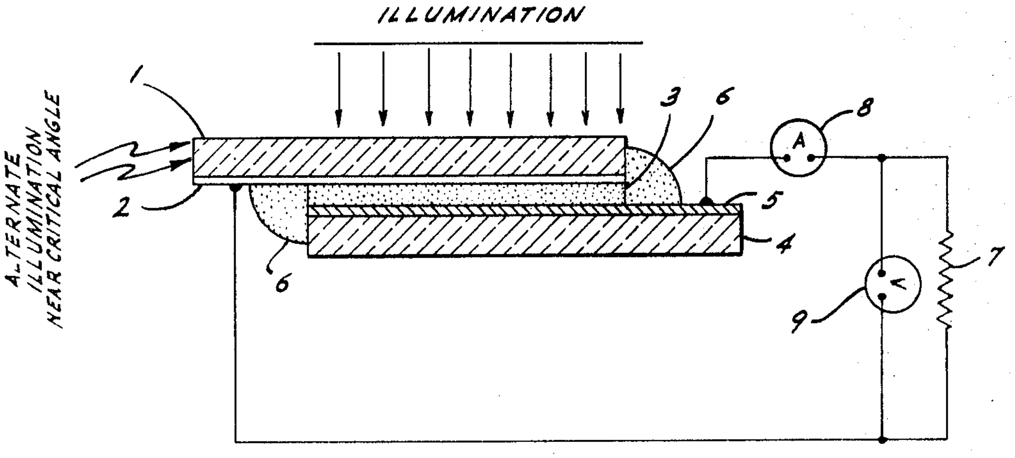
FIG. 1 shows in cross section the structure of a photovoltaic cell employing the preferred gell structure.

In the device shown in FIG. 1, glass plate 1 is coated with a transparent, conductive film 2 of tin oxide by the well known chemical vapor pyrolysis process. The film 2 may be doped with antimony oxide to lower its electrical resistance. Such tin oxide coated glass plates are available commercially. One well known version is known as Nesa Glass. A mixture of organic semiconductor, gel agent, and solvent is cast upon the conductive film 2 and the solvent allowed to partially evaporate. The resulting layer 3 of gel contains the organic semiconductor in a form that is highly responsive to optical energy. Glass backing plate 4 carries on its upper surface a conductive layer 5. It is pressed against the surface gel layer 3 after the solvent is sufficiently evaporated to produce the desired gel. Alternatively, gel layers can be cast on both the front plate film 2 and back plate film 5 and the gel surfaces pressed together. In still another alternative a bead 6 of suitable cement, such as an epoxy resin, can be cast around the completed cell to seal the device and hold glass plates together. Film 5 is desirably a metal that acts as a nonrectifying gel contact. Platinum has proven to be suitable, but any metal that is nonreactive and does not produce insulating surface layers will be useful. If the cell is to be illuminated from the back side, film 5 must be thin enough to be partly transparent. If no back side illumination is desired, film 5 can be made as thick as desired, or the entire back plate could be made of metal and used in place of glass plate 4 and film 5.

Excessive solvent evaporation can produce degraded cell performance and since additional evaporation can occur over extended periods of time, a solvent retention mechanism may be desired. The epoxy bead form of construction shown above, is effective if the casting operation is done properly. Alternatively, the addition to the gel of glycerol, a well-known humectant, will limit solvent evaporation and prevent excessive drying even over long periods of time in exposed cells.

Typically the cell is illuminated through glass plate 1, as shown, to provide area illumination. This is the method contemplated for most solar cell operation. However, the gel-dye material is not strongly optically absorptive, and radiant energy normal to the cell surface may not be completely absorbed at the critical region of the dye-tin oxide interface. Alternatively, the cell may be illuminated near the critical angle from the end, via the tin oxide coated glass 1, as shown. Such end illumination results in better excitation of the gel because of multiple surface reflections at the tin oxide film. For ordinary construction multiple attenuated reflections from film 2 are obtained if the angle of light incidence is near the critical angle. The multiple reflections cause the illumination to traverse a greater length of sensitive material and thereby produce better optical absorption.

The other circuit elements illustrated in FIG. 1 may be used to determine the power that the solar cell is capable of providing. Resistor 7 acts as the load for the cell. Ammeter 8 and voltmeter 9 monitor the cell output current and voltage. Output power is calculated by multiplying the voltage by the current. The resistance of load resistor 7 can be varied while maintaining constant illumination to evaluate cell performance. For example, the internal resistance of the cell can be calculated by observing the voltage-current characteristics of two load values. Also, the resistance of load 7 can be varied to determine the value that produces maximum power output.

Figure 2:
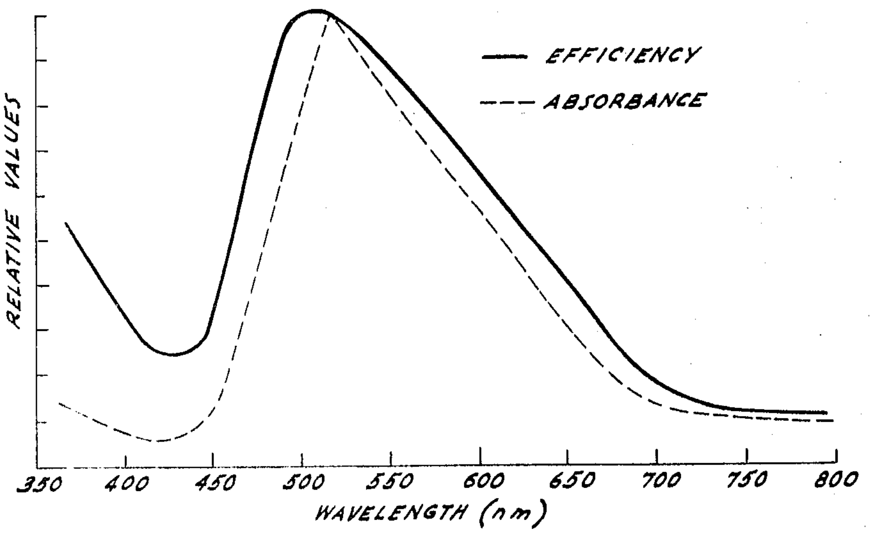
FIG. 2 is a graph showing the spectral characteristics of a photovoltaic cell using crystal violet as the sensitive material and the optical absorbance of the crystal violet gel film.

FIG. 2 shows the optical response of a cell employing crystal violet as the active semiconductor. The solid line shows the relative efficiency in producing electrical output, and the dashed line shows the characteristic absorbance of a crystal violet gel film, both as a function of light wavelength in nanometers —i.e., in billionths of a meter.

It can be seen that electrical performance is related to the optical absorption of the dye film. We have found that the gel materials most effective in practicing the invention have a tendency to shift the response or efficiency curve toward the blue end of the spectrum as compared with the alcohol solution absorbance curve of the dye used. In FIG. 2 the peak absorbance of the crystal violet gel film is at 515 nm, whereas the peak absorbance of crystal violet in an alcohol solution (not shown) is at 590 nm, a shift of 75 nm. In general dye supporting materials showing little or no such shift do not perform well as photovoltaic detectors.

Since absorption is related to electrical activity, better response to broadband radiation such as the solar source is related to greater broadband absorption. To achieve this several dyes can be incorporated into the casting mixture, each dye producing absorption in a limited different portion of the spectrum.

THEORY OF OPERATION

Crystal violet is known as a P-type semiconductor, conducting by means of electron vacancies. Tin oxide of the Nesa Glass type is known as a highly degenerate N-type semiconductor. When these two semiconductors are placed in intimate contact, as by casting a gel containing crystal violet onto the tin oxide film surface, a P-N junction is formed. The barrier associated with the p-N junction will act to separate charge carriers generated by the photo process. When a photon is absorbed by the crystal violet, an electron-hole pair is produced. If the event takes place sufficiently close to the barrier, the hole will migrate to the P-type semiconductor while the electron will migrate to the N-type semiconductor. The barrier prevents recombination and a photovoltage results.

It has been demonstrated that the crystal violet photocurrent activity is not chemical by showing that several times as much energy can be extracted from such a cell, without degrading performance, than would be available from the total quantity of chemical equivalent.

It is postulated that the crystal violet forms aggregate species which are photoactive. In a gel such aggregates are permitted to form without substantial hindrance. When forming films of the dye alone, as by solvent evaporation or vacuum sublimation, aggregate formation is inhibited, thereby reducing carrier mobility and increasing recombination. The ideal situation occurs where the entire active structure is solely dye aggregates, but this will only occur at relatively low dye concentrations. As a practical matter, the dye concentration is made as high as possible consistent with suitable aggregate formation. This usually occurs using about equal parts by weight of dye and gel material.

Example 1

A cell was constructed as shown in FIG. 1. The front electrode was tin oxide coated glass having a resistance of about 250 ohms per square. The rear electrode was an opaque film of bright platinum on glass. The active material was cast from a water solution of 6 percent by weight crystal violet and 5 percent by weight agar. This solution was prepared by dissolving the agar in boiling water and then adding the crystal violet. The hot solution was poured upon the rear electrode, whereupon the excess solvent quickly volitalized. The front electrode plate was then pressed against the exposed surface of the gel while it was still warm in such a manner as to avoid entrapment of air bubbles. This could be observed through the transparent electrode during its application. Excess gel material will be expelled from between the plates and can easily be trimmed off after the gel-dye solution cools. The resulting structure is sufficiently coherent to withstand handling. The film after the above treatment was typically about 0.1 mm thick. The dark resistance of a 10-$cm^2$ cell measured about $1.4 \times 10^4$ ohms. The maximum open circuit photovoltage was about 0.425 volt. Direct sunlight produced about 0.5 mw output or about 0.05 mw/$cm^2$. Considering incident sunlight at 100 mw/$cm^2$ this represents an efficiency of about 0.05 percent. The better prior art devices produced less than about a millimicrowatt ($10^{-9}$) per square cm.

Example 2

A device similar to that of Example 1 was used except that films of gold, silver, graphite and tin oxide were used in place of the platinum. Cell performance for each of these materials was satisfactory.

Example 3.

A device similar to that of Example 1 was used except that the casting solution contained in addition 20 percent glycerol. Electrical performance was about as described in Example 1 and unsealed cells continue to perform even after storage in excess of one year.

Example 4

A device similar to that of Example 1 was used except cadmium sulphide was evaporated over the tin oxide so that the N-type semiconductor was cadium sulphide. While the cell produced power its electrode resistance was high (about $10^6$ ohms/square) and its output was much lower.

Example 5

A device similar to that of Example 1 was used except that rosanilin, chrome azural-S, brilliant green, malachite green, basic fuschin, and rosolic acid were each used in place of the crystal violet. Each material produced useful photovoltaic energy but all were inferior in varying degrees to crystal violet in terms of efficiency.

Example 6

A device similar to that of Example 1 was used except that 2 percent by weight each of crystal violet, malachite green, and basic fuschin constituted the organic semiconductor. Each dye absorbs in a different portion of the solar spectrum. The power output was about three times that obtained from an equivalent crystal violet cell.

Example 7

Devices similar to that of Example 1 were used except that a number of cells were made having varying quantities of powdered cadmium sulphide added to the film casting mixture. Adding cadmium sulphide increased the cell output up to about 0.075 percent by weight where the cell output in response to white light was doubled. Further additions of cadmium sulphide decreased output. For the optimum addition, the yellow light response was trebled.

Example 8

Devices similar to that of Example 1 were used except that a number of cells were made using various substitutes for the agar. Support structures including gelatin, Cellex-D (an anion exchange resin), polyvinyl alcohol, and filter paper were successful in obtaining cell performance superior to prior art devices. However, the agar of Example 1 produced the best cells.

A new and greatly improved organic solar cell material has been described and several examples set forth. Because various equivalents and alternatives will occur to a person skilled in the art, it is intended that the invention be limited only by the following claims:

We claim:

1. An improved photovoltaic cell structure having an organic semiconductor active material located between conductive electrodes, at least one of which is transparent, wherein said improvement comprises:

an active material including an organic semiconductor contained in a gel.

2. The improved cell of claim 1 wherein said gel is agar.

3. The improved cell of claim 1 wherein said organic semiconductor comprises a mixture of different organic semiconductors, each having characteristic absorption in a different portion of the incident light spectrum.

4. The improved cell of claim 1 wherein said active material further includes light scattering particles.

5. The improved cell of claim 4 wherein said particles comprise cadmium sulphide.

6. The improved cell of claim 1 wherein the water content of said gel is controlled by including a humectant.

7. The improved cell of claim 6 wherein said humectant is glycerol.

8. A solar cell comprising:

an active material in ohmic contact with an area electrode, said active material comprising a gel containing an organic semiconductor, a transparent conductive area electrode in rectifying contact with said active material, and terminal connections to said electrodes.

9. The solar cell of claim 8 wherein said organic semiconductor comprises a plurality of different materials, each absorbing in a separate portion of the solar spectrum.

10. The solar cell of claim 8 wherein said organic semiconductor is crystal violet and said gel is agar.

* * * * *